(12) United States Patent
O Suilleabhain et al.

(10) Patent No.: US 7,928,584 B2
(45) Date of Patent: Apr. 19, 2011

(54) STACKED MEMS DEVICE

(75) Inventors: Liam O Suilleabhain, Bishopstown (IE); Raymond Goggin, Watergrasshill (IE); Eva Murphy, Raheen (IE); Kieran P. Harney, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/582,183

(22) Filed: Oct. 20, 2009

(65) Prior Publication Data

US 2010/0032268 A1 Feb. 11, 2010

Related U.S. Application Data

(63) Continuation of application No. 11/960,271, filed on Dec. 19, 2007, now Pat. No. 7,642,657.

(60) Provisional application No. 60/871,175, filed on Dec. 21, 2006.

(51) Int. Cl.
*H01L 23/48* (2006.01)
*H01L 23/52* (2006.01)
*H01L 29/40* (2006.01)

(52) U.S. Cl. ............................ 257/778; 438/50; 438/52

(58) Field of Classification Search .................. 257/778, 257/E21.613, E29.324; 438/50, 52
See application file for complete search history.

(56) References Cited

U.S. PATENT DOCUMENTS

| | | | | |
|---|---|---|---|---|
| 5,417,111 A | 5/1995 | Sherman et al. | | 73/517 |
| 5,620,931 A | 4/1997 | Tsang et al. | | 438/50 |
| 5,638,946 A | 6/1997 | Zavracky | | 200/181 |
| 5,858,809 A | 1/1999 | Chau et al. | | 438/52 |
| 6,441,481 B1 | 8/2002 | Karpman | | 257/711 |
| 6,768,207 B2 | 7/2004 | Tao et al. | | 257/777 |
| 6,846,725 B2* | 1/2005 | Nagarajan et al. | | 438/456 |
| 7,034,393 B2 | 4/2006 | Alie et al. | | 257/704 |
| 7,256,669 B2 | 8/2007 | Morrison, Jr. et al. | | 335/78 |
| 7,419,853 B2* | 9/2008 | Kuhmann et al. | | 438/113 |
| 2003/0119219 A1 | 6/2003 | Farcy et al. | | 438/51 |
| 2004/0196124 A1 | 10/2004 | Majumder et al. | | 335/78 |
| 2005/0168306 A1 | 8/2005 | Cohn et al. | | 335/78 |
| 2005/0218488 A1 | 10/2005 | Matsuo | | 257/678 |
| 2005/0218530 A1* | 10/2005 | Takayanagi et al. | | 257/784 |
| 2006/0194361 A1* | 8/2006 | Heck et al. | | 438/48 |
| 2007/0029654 A1 | 2/2007 | Sunohara et al. | | 257/678 |

FOREIGN PATENT DOCUMENTS

WO WO 2006/101689 9/2006

OTHER PUBLICATIONS

European Patent Office: Authorized Officer Iperione, Invitation to Pay Additional Fees and, Where Applicable, Protest Fee, PCT/US2007/088166, dated Sep. 2, 2008, 7 pages.

European Patent Office: Authorized Officer Meister, International Search Report and Written Opinion in PCT/US2007/088166, mailed Dec. 10, 2008, 18 pages.

* cited by examiner

*Primary Examiner* — Phuc T Dang
(74) *Attorney, Agent, or Firm* — Sunstein Kann Murphy & Timbers LLP

(57) ABSTRACT

A MEMS apparatus has a MEMS device sandwiched between a base and a circuit chip. The movable member of the MEMS device is attached at the side up against the circuit chip. The movable member may be mounted on a substrate of the MEMS device or formed directly on a passivation layer on the circuit chip. The circuit chip provides control signals to the MEMS device through wire bonds, vias through the MEMS device or a conductive path such as solder balls external to the MEMS device.

24 Claims, 5 Drawing Sheets

STACKED MEMS DEVICE

The present application is a continuation of U.S. patent application Ser. No. 11/960,271, filed Dec. 19, 2007, now issued as U.S. Pat. No. 7,642,657, which claims priority from U.S. Provisional Patent Application No. 60/871,175, filed Dec. 21, 2006. The full disclosures of both of these priority applications are hereby incorporated by reference herein.

FIELD OF THE INVENTION

The invention generally relates to packaging for MEMS devices and, more particularly, the invention relates to packaging for MEMS switches.

BACKGROUND OF THE INVENTION

To keep pace with market demands, circuit and system designers continually attempt to add more functionality to existing devices. This runs directly counter to strong industry trends, however, of reducing the size and footprint of such components. Moreover, packaging of these electronic devices often exasperates this problem by increasing the overall device size or footprint.

The packaging of microelectromechanical systems (MEMS) for use as switches presents additional challenges. The switch, typically made of gold, conducts an RF signal which can generate undesirable levels of RF interference and cause RF losses, especially if directed through a bond wire.

SUMMARY OF THE INVENTION

In accordance with one embodiment of the invention, a MEMS apparatus has a base with electrical interconnects, and a MEMS device with a first side secured to the base. The MEMS device further has a movable member attached at a second side. A circuit chip is secured to the second side of the MEMS device for controlling the movable member. Consequently, the MEMS device is positioned between the base and the circuit chip.

Among other ways, the MEMS device may be flip-chip connected to the base while wire bonds electrically connect the circuit chip to the base. Encapsulating material may substantially completely cover the circuit chip and the MEMS device. In further embodiments, the movable member of the MEMS device is formed on the circuit chip. Control signals from the circuit chip to the MEMS device can be routed directly between the two. Conductive bumps can be used in place of wire bonds to electrically connect the circuit chip to the base. Alternatively, the circuit chip can be electrically connected to the base through vias in the MEMS device and with conductive bumps from the vias to the base.

In accordance with a specific embodiment, the MEMS device is a switch. In particular, it may include a movable member made of gold. Such a MEMS device is provided with vias of conductive material and more particularly having a resistivity of less than 0.01 ohm per square. In one embodiment, the movable gold beam is suspended from a semiconductor substrate. A semiconductor cap encloses a chamber about the beam. Conductive bumps on the semiconductor cap provide electrical connection with vias through the cap. The circuit chip for controlling the movable gold beam is secured parallel to and on the semiconductor substrate. It may be secured by seal glass.

In accordance with another embodiment of the invention, a MEMS apparatus has a circuit chip with circuitry and a passivated surface (protecting the circuitry), and MEMS microstructure formed on the passivated surface. The MEMS apparatus also has a cap over the MEMS microstructure. The cap has a first conductive path for providing electrical communication with the MEMS microstructure.

The MEMS microstructure is suspended from the plane of the passivated surface. One or more electrical interconnects through the passivated surface may permit control signals from the circuit chip to pass directly to the MEMS microstructure. Moreover, the apparatus also may have a second conductive path for electrically communicating with the circuitry on the circuit chip. For example, the second conductive path may extend through the cap, or be external to the cap.

Other objects and advantages of the invention will become apparent to those skilled in the art from a review of the following description taken in conjunction with the drawings.

DESCRIPTION OF ILLUSTRATIVE EMBODIMENTS

Figure 1:
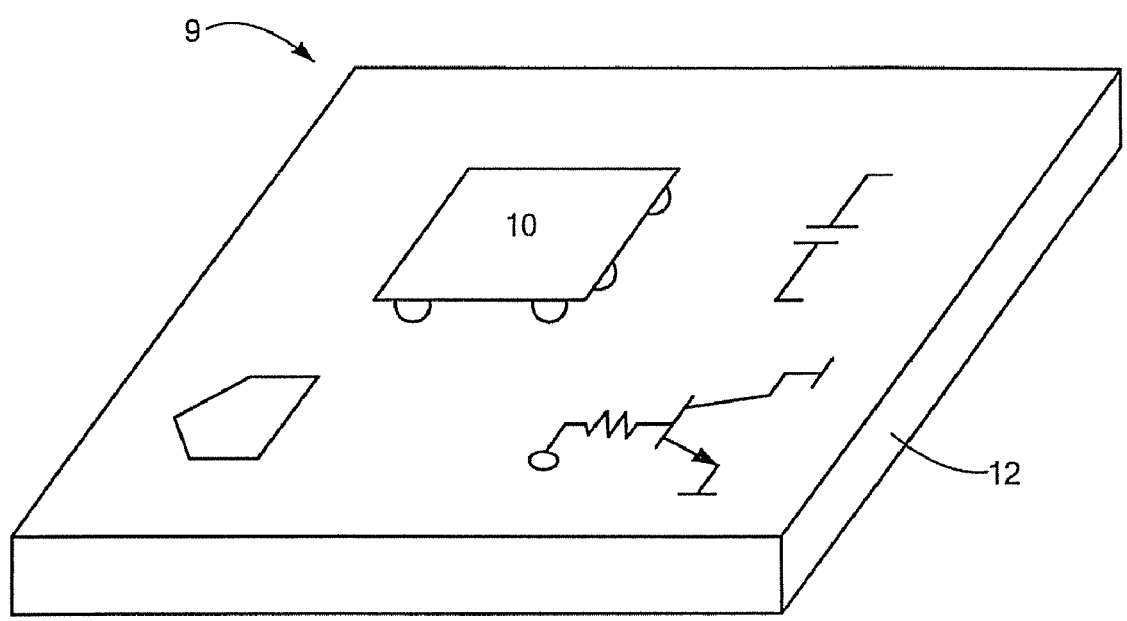
FIG. 1 schematically shows a perspective view of a system having a chip that may be configured in accordance with illustrative embodiments of the invention.

FIG. 1 schematically shows a perspective view of a system 9 having a chip 10 that may be configured in accordance with illustrative embodiments of the invention. Specifically, the system 9 has a printed circuit board 12 supporting a plurality of circuit elements that includes, among other things, the above noted chip 10. The plurality of circuit elements may comprise a variety of other components, such as transistors, capacitors, or other chips, necessary for effectuating a specific function. The plurality of circuit elements may cooperate as part of larger circuit systems, such as power converters, amplifiers, rectifiers, etc.

In illustrative embodiments of the invention, the chip 10 is a MEMS apparatus packaged either at the package level (e.g., FIGS. 2A-3), or at the wafer level (e.g., FIGS. 4A-5B). Specifically, the MEMS apparatus 10 may implement the functionality of a switch for radio frequency applications. To that end, the MEMS apparatus may be part of a larger system within a cellular telephone. Of course, discussion of a switch, specific frequencies, RF applications, and certain applications are merely illustrative and not intended to limit the scope or applicability of the invention. For example, the MEMS apparatus may incorporate a wide variety of MEMS devices and get used in a range of applications including those involving DC, low frequencies, high frequencies or a range of many frequencies.

Figure 2A:
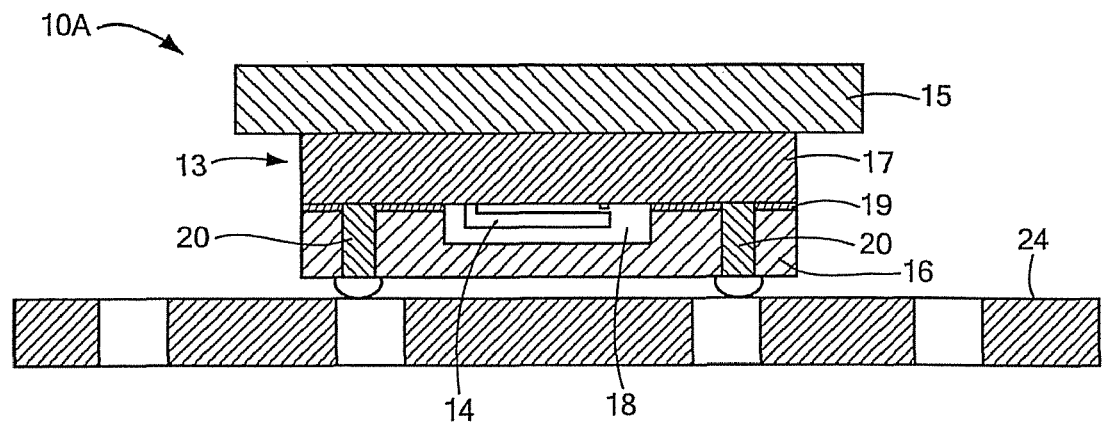
FIG. 2A schematically shows a cross-sectional view of the chip shown in FIG. 1 in accordance with a first embodiment of the invention. This view shows the chip in a partially completed form.
Figure 2B:
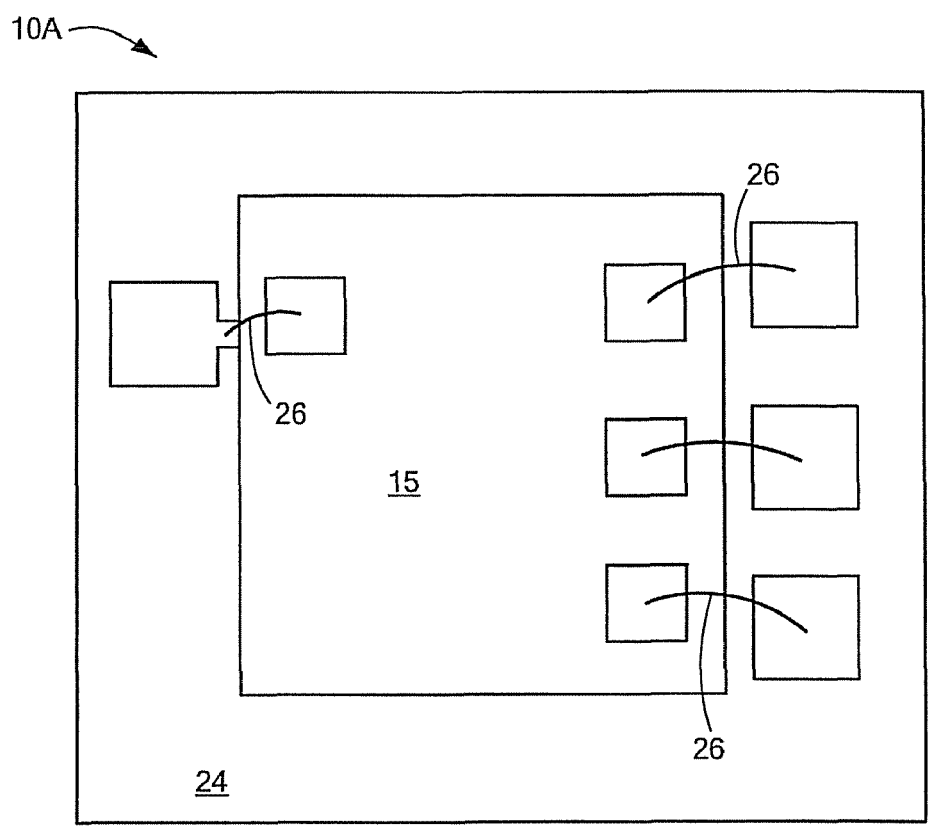
FIG. 2B schematically shows a top view of the chip shown in FIG. 2A.
Figure 3:
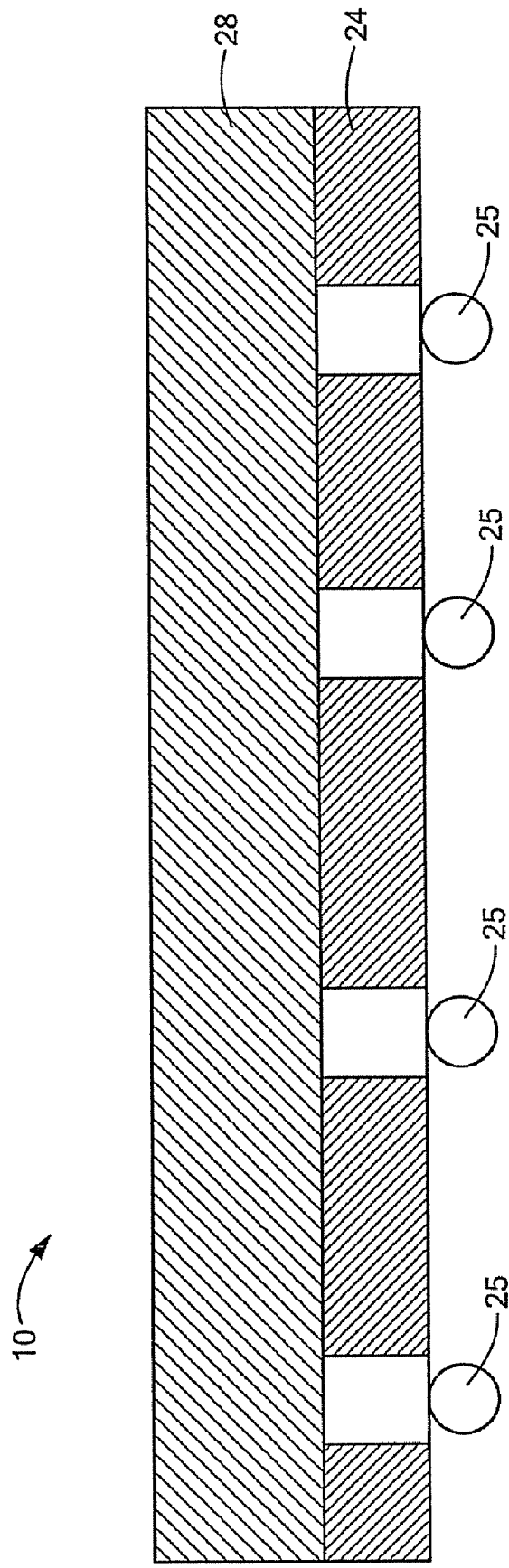
FIG. 3 schematically shows a side view of the chip shown in FIG. 2A after being subjected to molding processes.

FIG. 2A schematically shows a cross-sectional view of the MEMS apparatus 10A shown in accordance with a first embodiment of the invention. This view shows the apparatus in a partially completed form. FIG. 2B schematically shows a top view of the apparatus 10A shown in FIG. 2A. As shown in FIG. 2A, the MEMS apparatus 10A has a base 24 for supporting, in a stacked, flip chip configuration, a MEMS die 13 and circuit chip 15.

The MEMS die 13 includes a movable microstructure 14. In more specific embodiments, the MEMS die 13 implements the functionality of a switch that is controlled by, and interacts with, the circuit chip 15. To that end, the MEMS die 13 comprises microstructure 14 that is a movable beam suspended from a substrate 17. In this example, the microstructure 14 is a cantilevered arm having a free end separated by a gap from a contact on the substrate 17. The substrate 17 typically includes a thin (about 2 to 6 microns in specific embodiments) dielectric layer covering its surface and onto which the movable beam is attached. The dielectric layer or any other such passivation layer electrically isolates the substrate 17 from the cap 16.

To protect the microstructure 14, the MEMS die 13 also has a cap 16 forming an interior chamber 18 that contains the microstructure 14. In illustrative embodiments, both the substrate 17 and the cap 16 are formed from single crystal silicon. For an RF switch embodiment, it is useful for this silicon to exhibit high resistivity to reduce RF signal leakage. Of course, other materials may be used. The cap 16 may be affixed to the substrate 17 by a second passivation layer or seal glass layer 19. Conductive paths 20, implemented in this case as vias having a conductive fill material, extend through the cap 16 and the seal glass layer 19 to electrically connect the MEMS microstructure 14 with external components, such as the base 24 and the circuit chip 15. The flip chip connection between the vias 20 and electrical interconnects on the base 24 may be completed by conductive solder bumps.

In the embodiment of an RF switch, the microstructure 14 is preferably made of gold. One method of making the moveable gold beam is to begin with a seed layer of gold formed by sputtering. The seeded gold may be set in an electrolytic bath where gold in solution will be caused to gold plate the seeded gold. Furthermore, an RF switch operates best if the conductors carrying the RF are highly conductive. Thus, it is recommended for such an application that the vias 20 be made with a conductor having a resistivity of less than 0.01 ohm per square. Suitable conductive material for use in such vias includes aluminum, gold, copper or alloys of these materials.

The circuit chip 15 may be an integrated circuit capable of performing a specific function. For example, when implemented as a MEMS switch within a cellular telephone, the circuitry may be a differential MOSFET (often referred to as a "DMOS") application specific integrated circuit implementing, among other things, 1) the functionality of the charge pump for increasing battery voltage, and 2) a gate control circuit that controls movement of the microstructure 14. Of course, discussion of specific circuit functionality is illustrative and not intended to limit various embodiments of the invention.

The circuit chip 15 is attached parallel to and on the MEMS die 13. A die attach layer is typically used to hold a circuit chip 15 against the side of a MEMS die 13 from which the microstructure 14 is suspended to form a preliminary device. The preliminary device is flip-chip mounted onto the base 24 to effectively connect these components in a stacked configuration. The base 24 may be an electrical interconnect apparatus that electrically connects the MEMS die 13 and circuit chip 15. For example, the base 24 may be formed from printed circuit board material (e.g., FR-4), a ceramic carrier, or a premolded leadframe package base. Unlike the MEMS die 13, the circuit chip 15 electrically connects with the base 24 by means of a plurality of wire bonds 26. The wire bonds connect bond pads on the circuit chip 15 to bond pads on the base 24. In alternative embodiments, the circuit chip 15 may electrically connect by some other means, such as large solder balls or some means through the MEMS die 13.

As noted above, the illustrations in FIGS. 2A and 2B do not show the complete product. Instead, the complete product has an overmolded, encapsulating layer 28 that substantially completely encapsulates both the MEMS die 13 and circuit chip 15. In addition, the base 24 has an array of solder balls or bumps 25 on its bottom side for electrical mounting to the printed circuit board 12 as shown in FIG. 1.

Figure 4A:
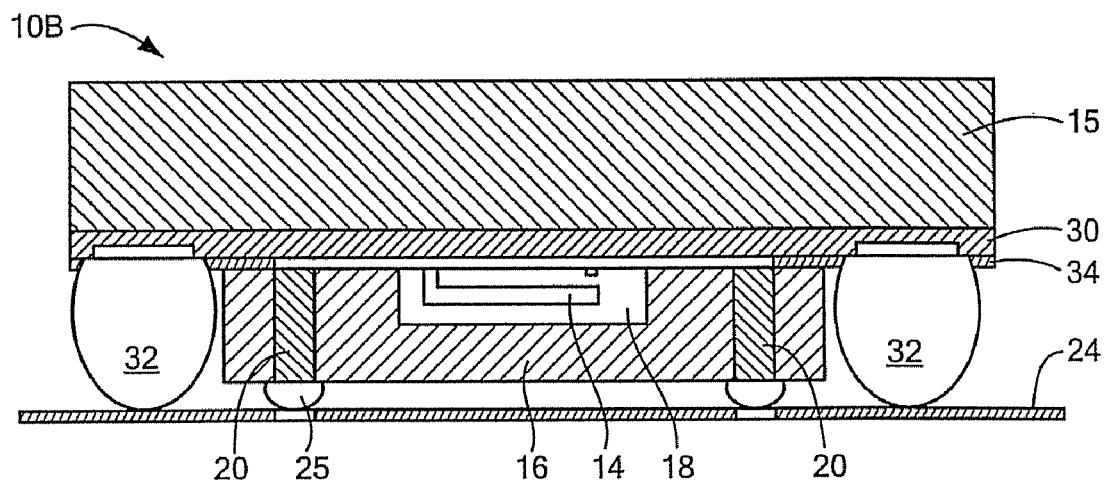
FIG. 4A schematically shows a cross-sectional view of the chip shown in FIG. 1 in accordance with a second embodiment of the invention.
Figure 4B:
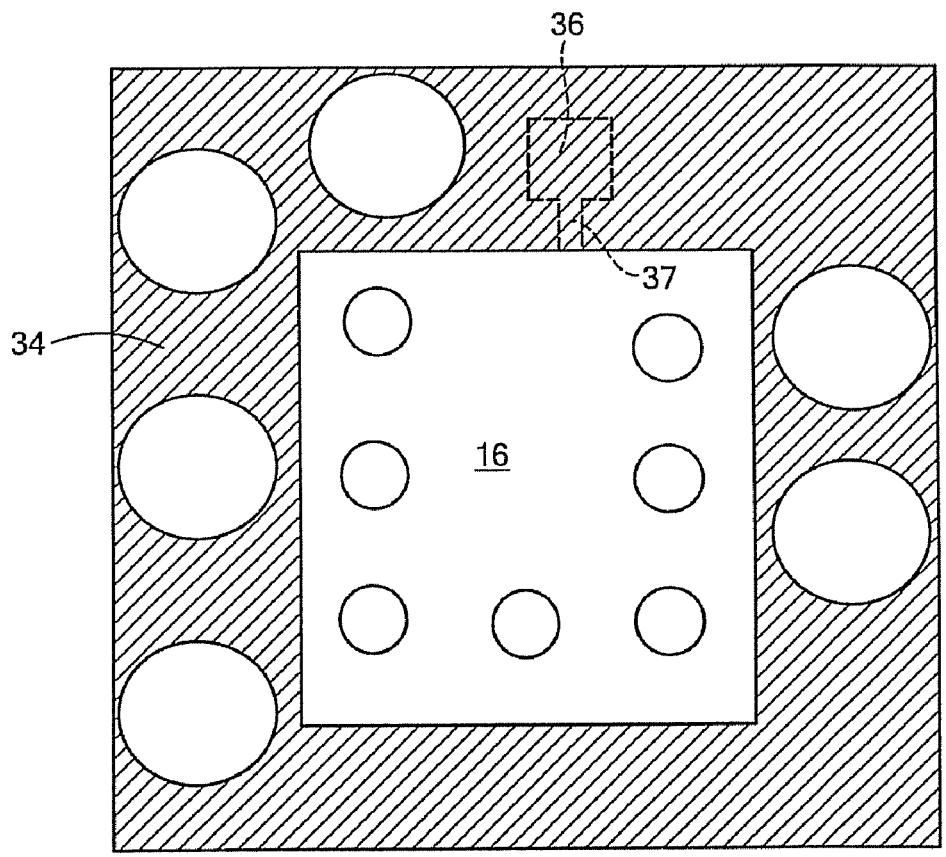
FIG. 4B schematically shows a bottom view of the chip shown in FIG. 4A.

FIG. 4A schematically shows a cross-sectional view of the chip 10B substitutable within FIG. 1 in accordance with a second embodiment of the invention. FIG. 4B schematically shows a bottom view of this embodiment. Unlike the embodiments discussed above, this embodiment benefits from a lower profile by integrating the circuit chip 15 and MEMS die 13 in a single unit that also similarly is in a stack configuration.

To those ends, the circuit chip 15 has circuitry protected by a passivation layer 30. Among other things, the passivation layer 30 may be nitride, alumina, or glass. Rather than providing control signals through the electrical interconnections in the base 24, with this embodiment control signals may be sent directly to the MEMS device. For example, bond pad 36 on the circuit chip 15 may be electrically connected along interconnect 37 or other vias (not shown) through the passivation layer 30 that terminate at pads for electrically connecting the circuitry with other components, such as the MEMS microstructure 14.

In accordance with this and related embodiments of the invention, conventional surface micromachining processes form the MEMS switch on top of the passivation layer 30, and secure a cap 16 around the microstructure 14. In a manner similar to other embodiments, vias 20 extending through the cap 16 may provide an electrical connection for the microstructure 14. In some implementations as will be explained with regard to a next embodiment, vias through the cap 16 may extend to the circuitry on the circuit chip 15. Large solder bumps 32 are used to provide an electrically conductive path from the circuitry of chip 15 to the electrical interconnects in the base 24. Control signals may be provided through the large solder bumps 32 into the electrical interconnects in the base 24 and back up through a via 20 to the microstructure. A second passivation layer 34 may be used to cover the connections, such as bond pad 36, between the circuit chip and the MEMS switch. The second passivation layer 34 thus protects against solder reflow that might cause a short circuit with an unprotected bond pad.

In a manner similar to the embodiment discussed above with regard to FIGS. 2A-3, this embodiment may have an encapsulating layer 28 for encapsulating the circuit chip 15 and MEMS die 13. No such encapsulation is necessary, however, because it uses a wafer level package. Accordingly, in some implementations, this embodiment does not have an encapsulating layer 28.

It should be noted that the circuitry should be capable of withstanding processing temperatures commonly associated with the surface micromachining process. If the circuitry cannot withstand such temperatures, then lower temperature micromachining processes may be used (e.g., lower temperature processes using xenon difluoride etchant).

Figure 5A:
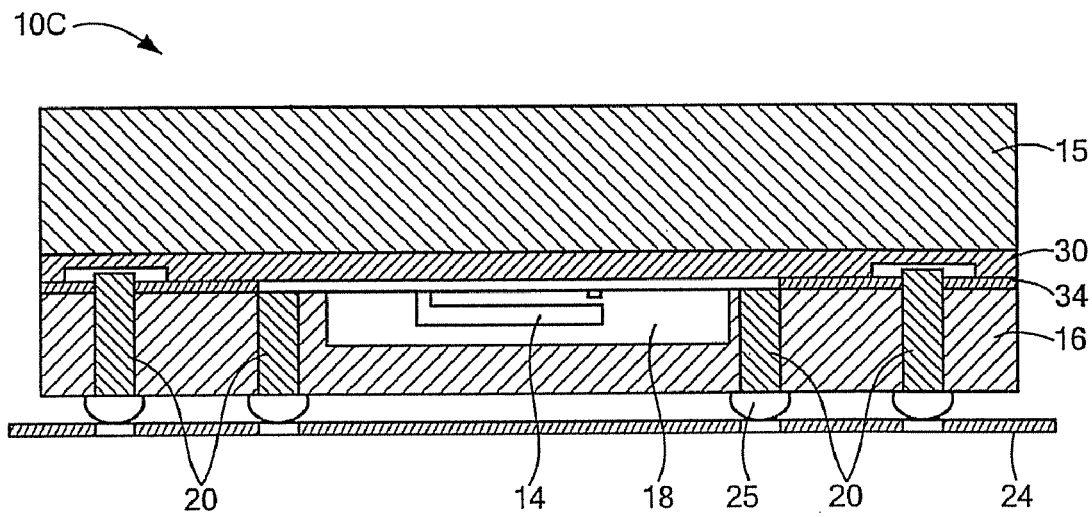
FIG. 5A schematically shows a cross-sectional view of the chip shown in FIG. 1 in accordance with a third embodiment of the invention.
Figure 5B:
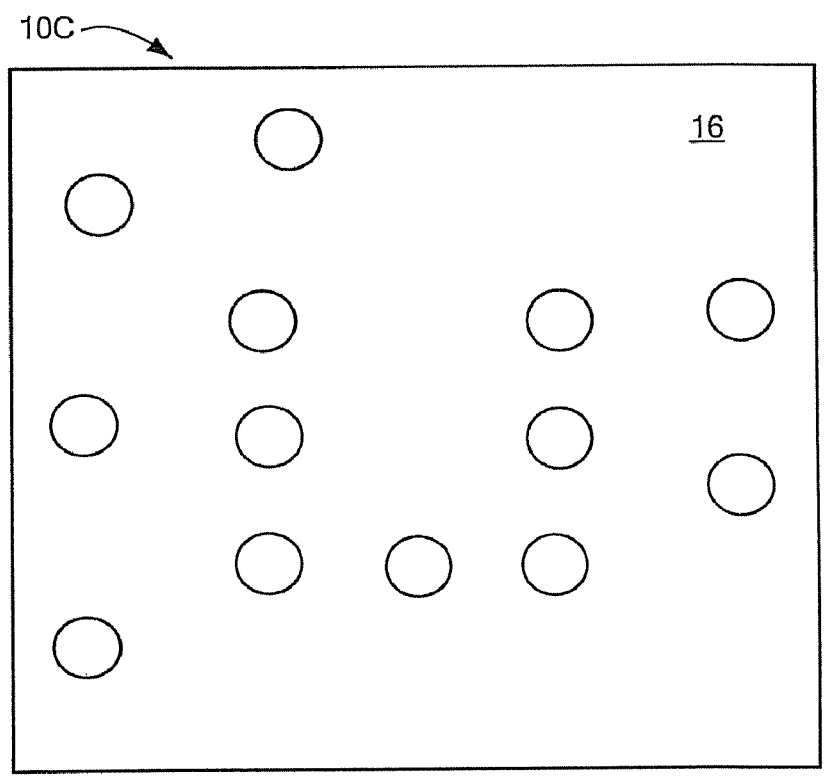
FIG. 5B schematically shows a bottom view of the chip shown in FIG. 5A.

FIG. 5A schematically shows a cross-sectional view of the chip 10C shown in FIG. 1 in accordance with a third embodiment of the invention. FIG. 5B schematically shows a bottom view of this embodiment. In a manner similar to the embodiment discussed above with regard to FIGS. 4A and 4B, this embodiment also forms the MEMS switch on the passivation layer 30 protecting the circuitry of the circuit chip 15.

Rather than using large solder balls to form the conductive path from the circuit chip 15 to the base 24, this embodiment uses vias 20 extending through the cap 16. These vias 20 should be made with a conductor having a resistivity of less than 0.01 ohm per square. This helps avoid creation of an undesirable voltage drop across the via. Flip chip connections, such as solder bumps, can be used to complete the electrical paths between the vias 20 and the electrical interconnects in the base 24.

The cap 16 is secured to the circuit chip 15 by a seal glass layer 34. Direct electrical interconnections through the passivation layer 30 and seal glass layer 34 can be made between bond pads on the circuit chip 15 and the microstructure 14. Such electrical interconnections are protected by the overlying cap 16 from exposure to accidental shorts. Accordingly, all of the electrical connections of this embodiment are formed within the confines of the cap 16. Control signals from the circuit chip 15 can be passed through the direct electrical interconnections or through the vias 20 to effect control of the microstructure 14.

Various embodiments shown in FIGS. 4A, 4B, 5A, and 5B thus use integrated devices having out-of-plane components. Specifically, the circuitry is fabricated on a first plane, while the microstructure is fabricated on a second plane. These and other embodiments should mitigate the size problems. A lower profile has been attained by the elimination of a substrate in the MEMS die.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS device comprising:
a circuit chip having an application specific integrated circuit and a passivated surface;
a MEMS microstructure formed on the passivated surface of the circuit chip;
a cap over the MEMS microstructure;
a first conductive path providing electrical communication between the MEMS microstructure and an external surface of the cap; and
a second conductive path extending from the circuit chip out beyond the external surface of the cap.

2. The MEMS device of claim 1 wherein the MEMS microstructure is suspended from the plane of the passivated surface.

3. The MEMS device of claim 1 wherein the second conductive path extends through the cap.

4. The MEMS device of claim 1 wherein the second conductive path is external to the cap.

5. The MEMS device of claim 4 wherein the second conductive path comprises at least one solder bump extending from the circuit chip out beyond the external surface of the cap.

6. The MEMS device of claim 1 wherein the second conductive path supplies control signals from the circuit chip for controlling movement of the MEMS microstructure.

7. The MEMS device of claim 1 further comprising encapsulating material substantially completely covering the circuit chip and the cap.

8. The MEMS device of claim 1 wherein the MEMS microstructure is made of gold and wherein the first conductive path comprises a conductive material with a resistivity less than 0.01 ohm per square.

9. The MEMS device of claim 1 wherein the circuit chip and MEMS microstructure are arranged such that control signals pass directly from the circuit chip to the MEMS microstructure.

10. A MEMS apparatus comprising:
a base having electrical interconnects;
a circuit chip having an application specific integrated circuit and a passivated surface;
a MEMS microstructure formed on the passivated surface of the circuit chip;
a cap over the MEMS microstructure, the cap being secured to the base;
a first conductive path providing electrical communication between the base and the MEMS microstructure; and
a second conductive path providing electrical communication between the circuitry of the circuit chip and electrical interconnects of the base.

11. The MEMS apparatus of claim 10 wherein the MEMS microstructure is suspended from the plane of the passivated surface.

12. The MEMS apparatus of claim 10 wherein the second conductive path extends through the cap.

13. The MEMS apparatus of claim 10 wherein the second conductive path is external to the cap.

14. The MEMS apparatus of claim 13 wherein the second conductive path comprises at least one solder bump extending from the circuit chip to the base.

15. The MEMS apparatus of claim 10 wherein the second conductive path supplies control signals from the circuit chip through the at least one of the electrical interconnects of the base to control movement of the MEMS microstructure.

16. The MEMS apparatus of claim 10 further comprising encapsulating material substantially completely covering the circuit chip and the cap.

17. The MEMS apparatus of claim 10 wherein the MEMS microstructure is made of gold and wherein the first conductive path comprises a conductive material with a resistivity less than 0.01 ohm per square.

18. The MEMS apparatus of claim 10 wherein the circuit chip and MEMS microstructure are arranged such that control signals pass directly from the circuit chip to the MEMS microstructure.

19. A switch comprising:
a MEMS device having a cap side, a substrate side and a movable member, the movable member attached at the substrate side and enclosed within a chamber between the substrate side and the cap side; and
an application specific integrated circuit at the substrate side of the MEMS device for electrically controlling the movable member between an open position breaking an electrical connection to the substrate side and a closed position completing an electrical connection to the substrate side; and
a conductive flip chip connection attached externally to the cap side of the MEMS device.

20. The switch of claim 19 wherein the flip chip connection comprises at least one solder bump.

21. The switch of claim 19 wherein the circuit chip serves as the substrate side of the MEMS device and the movable member is formed on the circuit chip.

22. The switch of claim 19 wherein the circuit chip is arranged flat on the substrate side of the MEMS device such that control signals pass directly from the circuit chip to the MEMS device.

23. The switch of claim 19 wherein the MEMS device comprises vias of conductive material having a resistivity of less than 0.01 ohm per square and wherein the movable member is made of gold.

24. The switch of claim 19 further comprising a circuit chip containing the application specific integrated circuit and encapsulating material molded over both the circuit chip and the MEMS device to substantially completely cover the circuit chip and the MEMS device.

* * * * *